(12) United States Patent
Kim et al.

(10) Patent No.: US 9,907,157 B2
(45) Date of Patent: Feb. 27, 2018

(54) NOISE BLOCKING PRINTED CIRCUIT BOARD AND MANUFACTURING METHOD THEREOF

(71) Applicant: Samsung Electro-Mechanics Co., Ltd., Suwon-si (KR)

(72) Inventors: Se Jong Kim, Suwon-si (KR); Sang Ho Choi, Suwon-si (KR); Jeong Hae Kim, Suwon-si (KR); Hyung Jun Cho, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/656,237

(22) Filed: Mar. 12, 2015

(65) Prior Publication Data

US 2016/0120025 A1 Apr. 28, 2016

(30) Foreign Application Priority Data

Oct. 28, 2014 (KR) ........................ 10-2014-0147089

(51) Int. Cl.
*H05K 1/03* (2006.01)
*H05K 1/02* (2006.01)
*H05K 1/18* (2006.01)

(52) U.S. Cl.
CPC ......... *H05K 1/0218* (2013.01); *H05K 1/0243* (2013.01); *H05K 1/185* (2013.01); *H05K 2201/0187* (2013.01); *H05K 2201/0355* (2013.01); *H05K 2201/0723* (2013.01); *H05K 2201/09972* (2013.01); *H05K 2201/09981* (2013.01); *H05K 2201/1056* (2013.01); *H05K 2201/10553* (2013.01); *H05K 2203/0191* (2013.01)

(58) Field of Classification Search
CPC ................... H05K 3/284; H05K 3/429; H05K 2201/0723; H05K 1/0219; H05K 1/115; H05K 1/185; H05K 3/321; H05K 3/305; H05K 3/42; H05K 3/426; H05K 3/427; H05K 3/428
USPC ........ 174/255, 250, 256–258, 260, 261, 262
See application file for complete search history.

(56) References Cited

U.S. PATENT DOCUMENTS

| | | | |
|---|---|---|---|
| 2009/0084596 A1 | 4/2009 | Inoue et al. | |
| 2010/0288535 A1 | 11/2010 | Hong et al. | |
| 2012/0154068 A1* | 6/2012 | Hsu | H03H 9/0547 331/158 |
| 2013/0258623 A1* | 10/2013 | Zeng | H05K 1/186 361/763 |

FOREIGN PATENT DOCUMENTS

| | | |
|---|---|---|
| JP | 2009-81423 A | 4/2009 |
| KR | 10-2008-0025949 A | 3/2008 |
| KR | 10-2010-0123399 A | 11/2010 |

* cited by examiner

*Primary Examiner* — Tremesha S Willis
(74) *Attorney, Agent, or Firm* — NSIP Law

(57) ABSTRACT

There are provided a printed circuit board and a manufacturing method thereof. The printed circuit board includes: a core layer having a cavity provided therein; an electronic component included in the cavity; a conductive partition disposed on a side of the cavity; and insulating layers disposed on and below the core layer.

16 Claims, 7 Drawing Sheets

NOISE BLOCKING PRINTED CIRCUIT BOARD AND MANUFACTURING METHOD THEREOF

CROSS-REFERENCE TO RELATED APPLICATION

This application claims the priority and benefit of Korean Patent Application No. 10-2014-0147089 filed on Oct. 28, 2014, with the Korean Intellectual Property Office, the disclosure of which is incorporated herein by reference.

BACKGROUND

The present disclosure relates to a printed circuit board and a manufacturing method thereof.

Requirements for high levels of performance, miniaturization, and thinness in electronic products have increased, in accordance with the development of electronics industry. In order to cope with the above-mentioned trend, printed circuit boards in which areas available for the mounting of electronic components have been reduced through embedding the electronic components in the interior thereof have been developed.

Related Art Document (Patent Document 1) Japanese Patent Laid-Open Publication No. 2009-081423

SUMMARY

An aspect of the present disclosure may provide a printed circuit board blocking radio frequency (RF) noise and thermal noise generated by embedded electronic components and discharging the noise through a discharge path, and a manufacturing method thereof.

According to an aspect of the present disclosure, a printed circuit board may include: a core layer having a cavity provided therein; an electronic component included in the cavity; a conductive partition disposed on a side of the cavity; and insulating layers disposed on and below the core layer.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
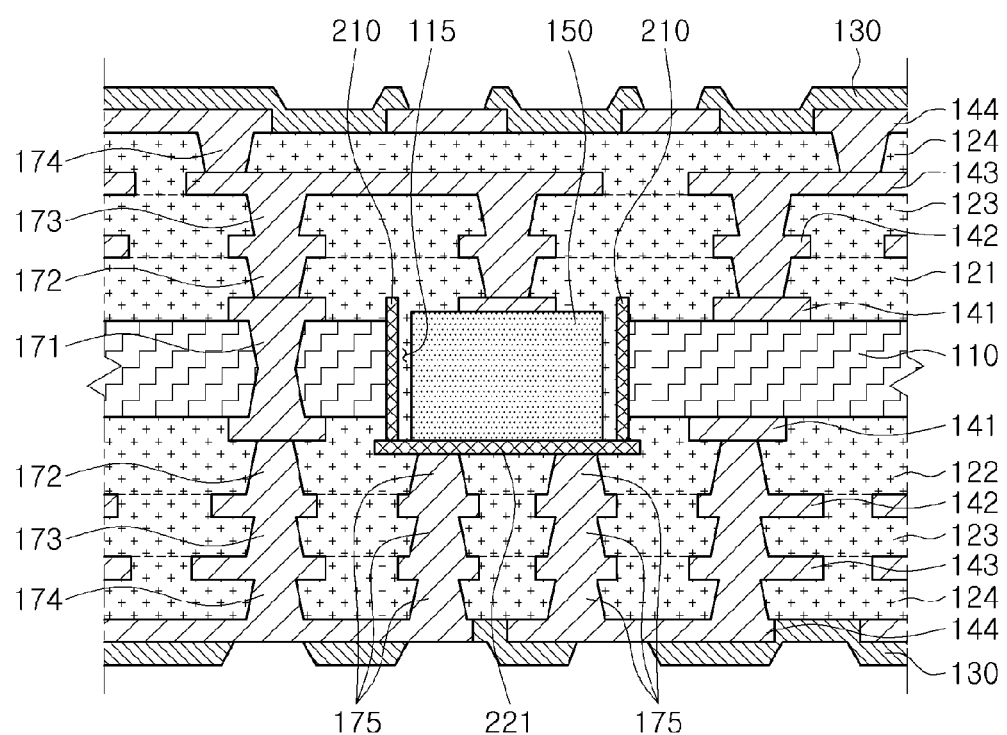
FIG. 1 is a cross-sectional view showing a structure of a printed circuit board according to an exemplary embodiment of the present disclosure.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Printed Circuit Board

FIG. 1 is a cross-sectional view showing a structure of a printed circuit board according to an exemplary embodiment of the present disclosure.

Referring to FIG. 1, a printed circuit board according to an exemplary embodiment of the present disclosure may include a core layer 110 having a cavity 115 disposed therein, an electronic component 150 included in the cavity 115, a conductive partition 210 disposed on a side of the cavity 115, and insulating layers 121 and 122 disposed on and below the core layer 110.

Radio frequency (RF) noise and thermal noise generated by an embedded electronic component may be transferred to other signal circuit layers and signal vias in the printed circuit board, thereby deteriorating signal quality.

In addition, in the case in which the thermal noise generated by the embedded electronic component is not properly discharged, it may raise total temperature of the printed circuit board, thereby deteriorating performance of a product.

Therefore, according to an exemplary embodiment of the present disclosure, the conductive partitions 210 may be formed on the sides of the cavity 115 in which the electronic component 150 is embedded, so as to allow the RF noise and the thermal noise generated from the embedded electronic component 150 to be effectively blocked.

The core layer 110 may have a structure having inner layer circuits 141 formed on an upper surface and a lower surface of the insulating layer and the inner layer circuits 141 formed on the upper surface and the lower surface of the insulating layer may be electrically connected to each other through a core via 171.

The core layer 110 may be provided with the cavity 115 penetrating through the core layer 110 so that the electronic component 150 may be inserted thereinto. The cavity 115 may be formed by a punch or a blade.

The electronic component 150 may be included in the cavity 115 and may be buried in the cavity 115 by the insulating layers 121 and 122 formed on and below the core layer 110.

The disposing of the conductive partitions 210 on the sides of the cavity 115 may mean that the conductive partitions 210 are formed on side surfaces of the core layer 110 which are adjacent to the cavity 115 in the core layer 110 having the cavity 115 formed therein.

In the case in which the cavity 115 is formed in a hexahedral shape, the conductive partitions 210 may be disposed on one or more sides of four sides of the cavity 115, and more preferably, the conductive partitions 210 may be disposed on all four sides of the cavity 115 in order to effectively block the RF noise and the thermal noise.

As a material of the conductive partition 210, as long as it is a conductive material capable of effectively blocking noise generated from the electronic component 150, any material may be used without being limited. For example, at least one selected from the group consisting of copper (Cu), aluminum (Al), and invar may be used.

The conductive partitions 210 may be formed by performing a plating process or a foil deposition process on the sides of the cavity 115. However, the process of forming the conductive partitions 210 is not necessarily limited thereto, but as long as it may form the conductive partitions capable of effectively blocking noise generated by the electronic component 150, any process may be used to form the conductive partitions 210.

According to an exemplary embodiment of the present disclosure, the printed circuit board may further include a lower conductive shielding layer 221 disposed below the cavity 115.

By forming the lower conductive shielding layer 221 below the cavity 115, the RF noise and the thermal noise generated by the electronic component 150 embedded in the cavity 115 may be more effectively blocked and a discharge path in which the noise may be discharged to the outside may be provided.

As a material of the lower conductive shielding layer 221, similar to the conductive partition 210, as long as it is a conductive material capable of effectively blocking the noise generated by the electronic component 150, any material may be used without being limited. For example, at least one selected from the group consisting of copper (Cu), aluminum (Al), and invar may be used.

The lower conductive shielding layer 221 may be formed by performing a plating process on a lower portion of the cavity 115 or attaching a conductive supporting tape to the lower portion of the cavity 115. However, the process of forming the lower conductive shielding layer 221 is not necessarily limited thereto, but as long as it may form the conductive shielding layer capable of effectively blocking the noise generated by the electronic component 150, any process may be used to form the lower conductive shielding layer 221.

As such, according to an exemplary embodiment of the present disclosure, the electronic component 150 embedded in the core layer 110 may be surrounded by the conductive partitions 210 and the conductive shielding layer 221.

However, the electronic component 150 does not necessarily need to be directly connected to the conductive partitions 210 and the conductive shielding layer 221, but a shape in which an insulating layer 121 is filled in a space between the electronic component 150 and the conductive partitions 210 or the conductive shielding layer 221 may be possible.

In addition, the cavity 115 in which the electronic component 150 is embedded does not necessarily need to have a structure in which it is perfectly blocked by the conductive partitions 210 and the conductive shielding layer 221, and as long as it may effectively block the noise generated by the electronic component 150, any shape may be possible.

As the insulating layers 121 and 122, a resin insulating layer may be used. As materials of the resin insulating layer, a thermosetting resin such as an epoxy resin, a thermoplastic resin such as polyimide, a resin having a reinforcement material such as glass fiber or inorganic filler impregnated in them, for example, a prepreg may be used. However, the materials of the resin insulating layer are not particularly limited thereto.

The insulating layers 121 and 122 may have first outer layer circuits 142 formed on surfaces thereof, and the inner layer circuits 141 and the outer layer circuits 142 of the core layer 110 may be electrically connected to each other through first signal vias 172 penetrating through the insulating layers 121 and 122.

In addition, insulating layers 123 may be further formed on the first outer layer circuits 142, second outer layer circuits 143 may be formed on surfaces of the insulating layers 123, and the first and second outer layer circuits 142 and 143 may be electrically connected to each other through second signal vias 173 penetrating through the insulating layers 123.

A shape in which the insulating layers 124 are further formed on the second outer layer circuits 143 and the printed circuit board includes third signal vias 174 connecting third outer layer circuits 144 formed on surfaces of the insulating layers 124 and the second and third outer layer circuits 143 and 144 is shown in FIG. 1, but the present disclosure is not necessarily limited thereto. For example, as long as the outer layer circuits are formed within the scope which may be utilized by those skilled in the art, the number of outer layer circuits which are formed may be adjusted.

Meanwhile, according to an exemplary embodiment of the present disclosure, the printed circuit board may further include discharging vias 175 formed so as to penetrate through the insulating layers 122, 123, and 124 and electrically connected to at least one of the conductive partitions 210 and the lower conductive shielding layer 221 so as to discharge the noise to the outside.

The RF noise and the thermal noise generated by the embedded electronic component 150 may be blocked by the conductive partitions 210 and the conductive shielding layer 221 and the noise may be discharged to the outside along a discharge path through the discharging vias 175.

Meanwhile, a solder resist 130 may be disposed on a surface of the printed circuit board so as to expose a circuit pattern for external connection pad of the outermost layer circuit 144.

Figure 2:
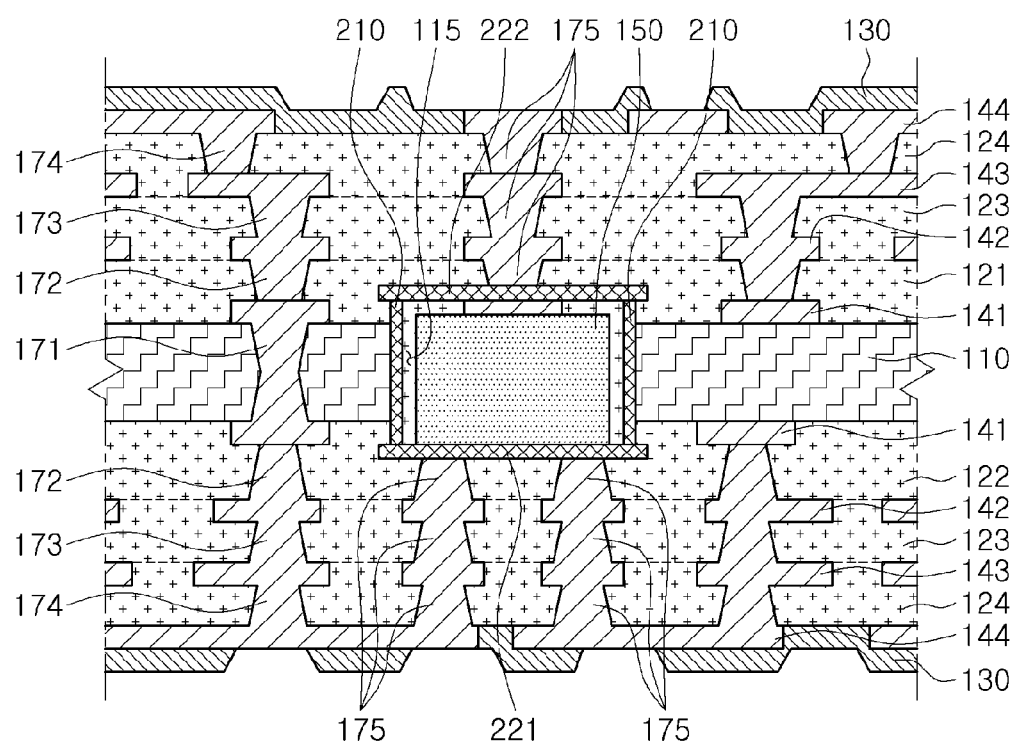
FIG. 2 is a cross-sectional view showing a structure of a printed circuit board according to another exemplary embodiment of the present disclosure.

FIG. 2 is a cross-sectional view showing a structure of a printed circuit board according to another exemplary embodiment of the present disclosure.

Referring to FIG. 2, the printed circuit board according to another exemplary embodiment of the present disclosure may further include an upper conductive shielding layer 222 disposed on the cavity 115.

By further forming the upper conductive shielding layer 221 on the cavity 115, the RF noise and the thermal noise generated by the electronic component 150 embedded in the cavity 115 may be more effectively blocked and discharge paths in which the noise may be discharged to the outside may be provided to both an upper side and a lower side of the electronic component 150.

As a material of the upper conductive shielding layer 222, similar to the lower conductive shielding layer 221, as long as it is a conductive material capable of effectively blocking the noise generated by the electronic component 150, any material may be used without being limited. For example, at least one selected from the group consisting of copper (Cu), aluminum (Al), and invar may be used.

According to another exemplary embodiment of the present disclosure that further includes the upper conductive shielding layer 222, the printed circuit board may further include the discharging vias 175 formed so as to penetrate through the insulating layers 122, 123, and 124 and electrically connected to at least one of the conductive partitions 210 and the upper conductive shielding layer 222 so as to discharge the noise to the outside, at an upper side of the electronic component 150.

Method of Manufacturing Printed Circuit Board

FIGS. 3 through 11 are views sequentially showing a method of manufacturing a printed circuit board according to an exemplary embodiment of the present disclosure.

Figure 3:
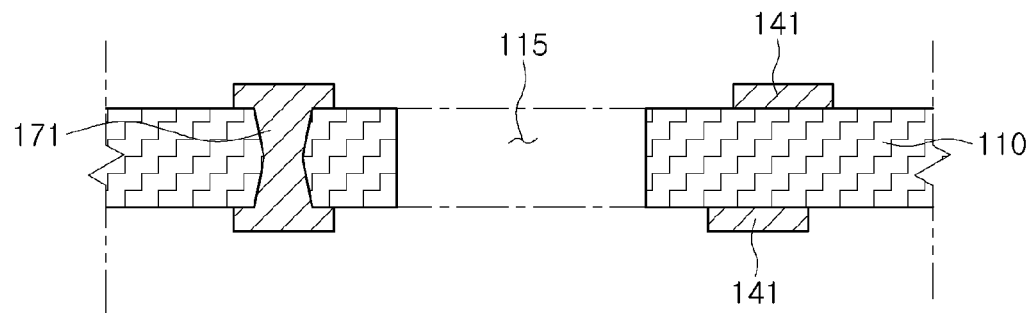
FIGS. 3 through 11 are views sequentially showing a method of manufacturing a printed circuit board according to an exemplary embodiment of the present disclosure.

Referring to FIG. 3, first, the cavity 115 may be formed in the core layer 110.

The core layer 110 may have a structure having inner layer circuits 141 formed on an upper surface and a lower surface of the insulating layer and the inner layer circuits 141 formed on the upper surface and the lower surface of the insulating layer may be electrically connected to each other through a core via 171.

The inner layer circuit 141 may be formed by selectively forming an etching resist on a copper layer of a copper clad laminate by a photo-lithography method and applying an etchant on a copper layer region on which the etching resist is not formed, so as to selectively remove the copper layer.

The core via 171 for an electrical connection between the inner layer circuits 141 may be formed by forming a through-hole in the core layer 110 and plating the through-hole.

The cavity 115 may be formed by laser, a punch or a blade.

Figure 4:
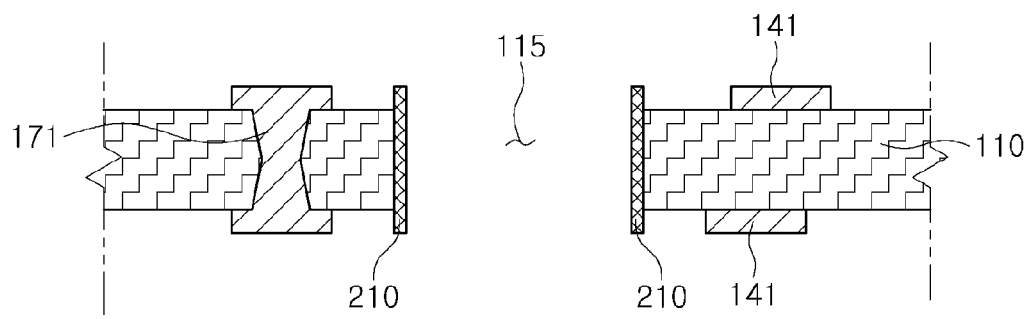

Referring to FIG. 4, the conductive partitions 210 may be formed on sides of the cavity 115.

The sides of the cavity 115 may mean side surfaces of the core layer 110 which are adjacent to the cavity 115 in the core layer 110 having the cavity 115 formed therein.

In the case in which the cavity 115 is formed in a hexahedral shape, the conductive partitions 210 may be formed on one or more sides of four sides of the cavity 115, and more preferably, the conductive partitions 210 may be formed on all four sides of the cavity 115 in order to effectively block the RF noise and the thermal noise.

The conductive partitions 210 may be formed by performing a plating process or a foil deposition process on the sides of the cavity 115. However, the process of forming the conductive partitions 210 is not necessarily limited thereto, but as long as it may form the conductive partitions capable of effectively blocking noise generated by the electronic component 150, any process may be used to form the conductive partitions 210.

The conductive partition 210 may include at least one selected from the group consisting of copper (Cu), aluminum (Al), and invar, for example.

Figure 5:
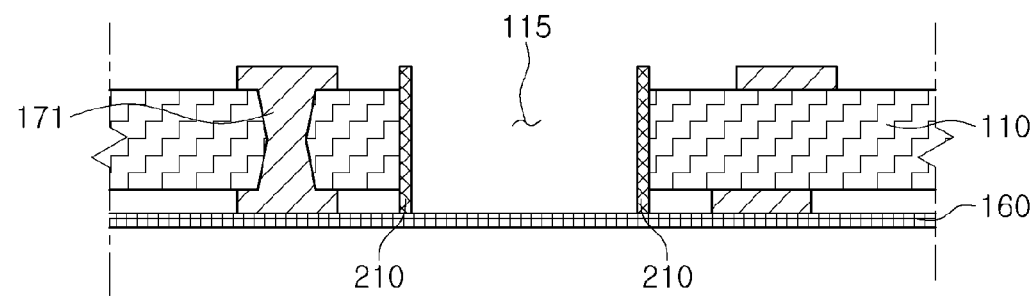

Referring to FIG. 5, a supporting tape 160 may be formed below the core layer 110.

The supporting tape 160 may serve to temporarily fix the electronic component 150 inserted into the cavity 115.

Figure 6:
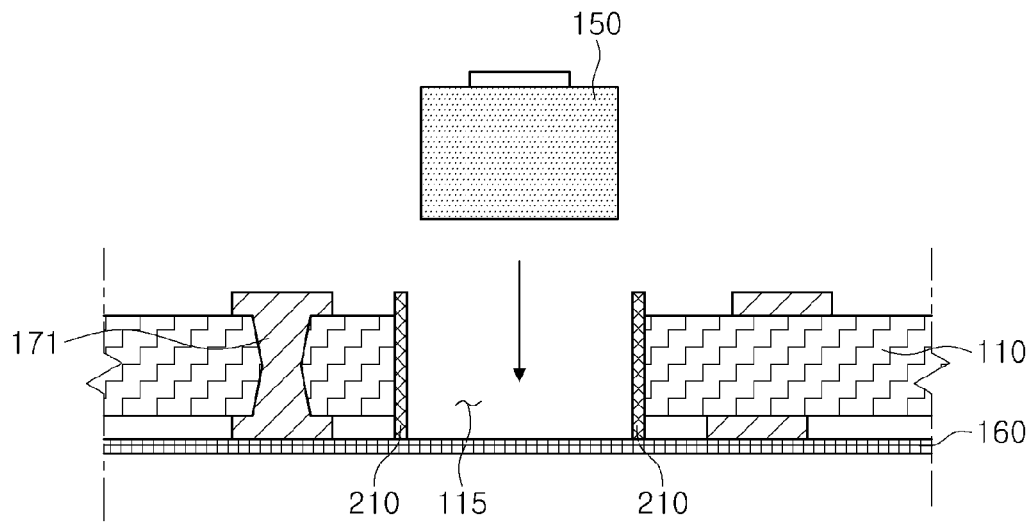

Referring to FIG. 6, the electronic component 150 may be inserted into the cavity 115.

The electronic component 150 inserted into the cavity 115 may be attached to the supporting tape 160 so as to be fixed thereto.

Figure 7:
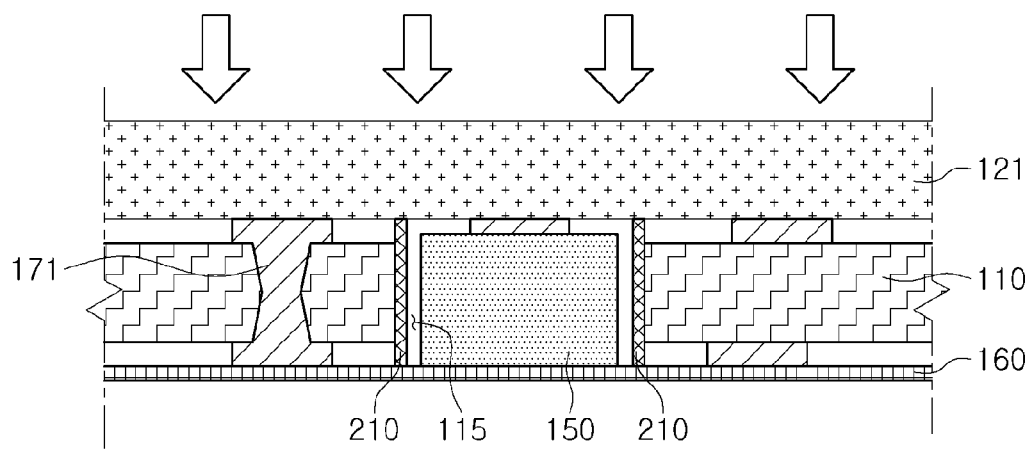

Referring to FIG. 7, an insulating layer 121 may be stacked on the core layer 110 so as to cover the electronic component 150.

As the insulating layer 121, a resin insulating layer may be used. As materials of the resin insulating layer, a thermosetting resin such as an epoxy resin, a thermoplastic resin such as polyimide, a resin having a reinforcement material such as glass fiber or inorganic filler impregnated in them, for example, a prepreg may be used. However, the materials of the resin insulating layer are not particularly limited thereto.

By stacking the insulating layer 121 on the core layer 110 and applying heat and pressure thereto, a space between the electronic component 150 and the conductive partitions 210 may be filled with the insulating layer 121, so as to fix the electronic component 150 within the cavity 115.

Figure 8A:
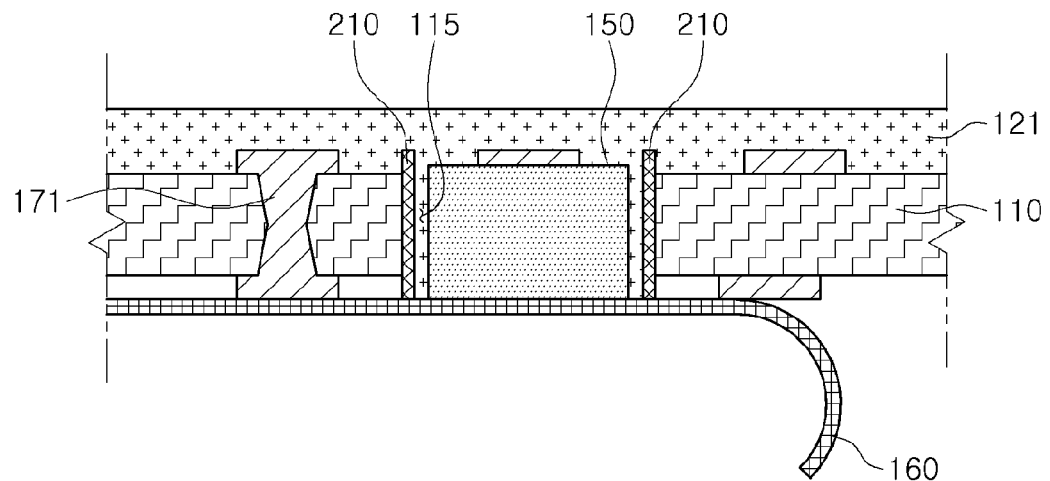

Referring to FIG. 8A, the supporting tape 160 may be removed.

After the electronic component 150 is fixed within the cavity 115 by forming the insulating layer 121 on the core layer 110, the supporting tape 160 may be removed.

As a material of the supporting tape 160, a material that does not leave residues at the time of the removal may be used so as not to influence a process after the removal the supporting tape 160.

Figure 8B:
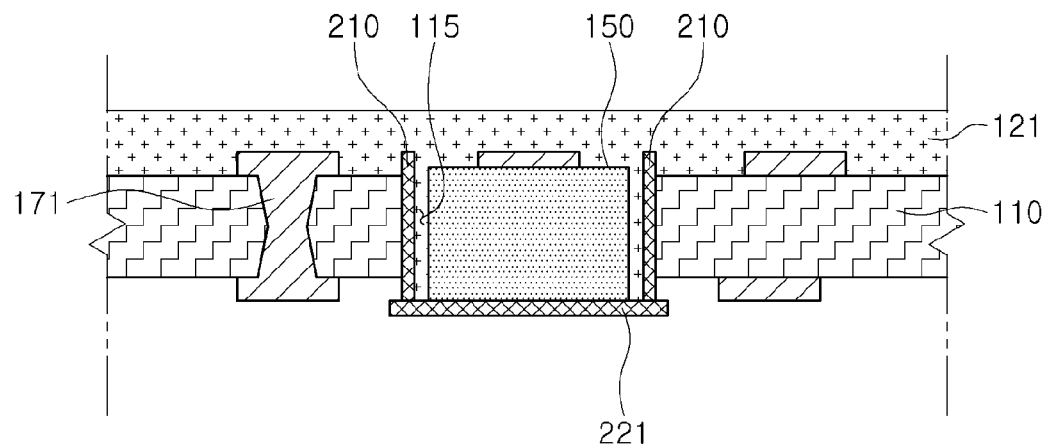

Referring to FIG. 8B, the lower conductive shielding layer 221 may be further formed below the cavity 115.

By forming the lower conductive shielding layer 221 below the cavity 115, the RF noise and the thermal noise generated by the electronic component 150 embedded in the cavity 115 may be more effectively blocked and a discharge path in which the noise may be discharged to the outside may be provided.

The lower conductive shielding layer 221 may be formed by performing a plating process on the lower portion of the cavity 115 after the removal of the supporting tape 160.

In addition, according to another exemplary embodiment of the present disclosure, in the case in which as the supporting tape 160, a conductive supporting tape including at least one selected from the group consisting of copper (Cu), aluminum (Al), and invar, the conductive supporting tape may be immediately used as the lower conductive shielding layer 221 without not being removed.

The lower conductive shielding layer 221 may include at least one selected from the group consisting of copper (Cu), aluminum (Al), and invar, for example.

Meanwhile, according to another exemplary embodiment of the present disclosure, the upper conductive shielding layer 222 may be further formed on the cavity 115.

When the upper conductive shielding layer 222 is further formed, the upper conductive shielding layer 222 may be formed (not shown) before the insulating layer 121 is stacked on the core layer 110.

The upper conductive shielding layer 222 may be formed by performing the plating process, or the like, similar to the lower conductive shielding layer 221, and may include at least one selected from the group consisting of copper (Cu), aluminum (Al), and invar.

Figure 9:
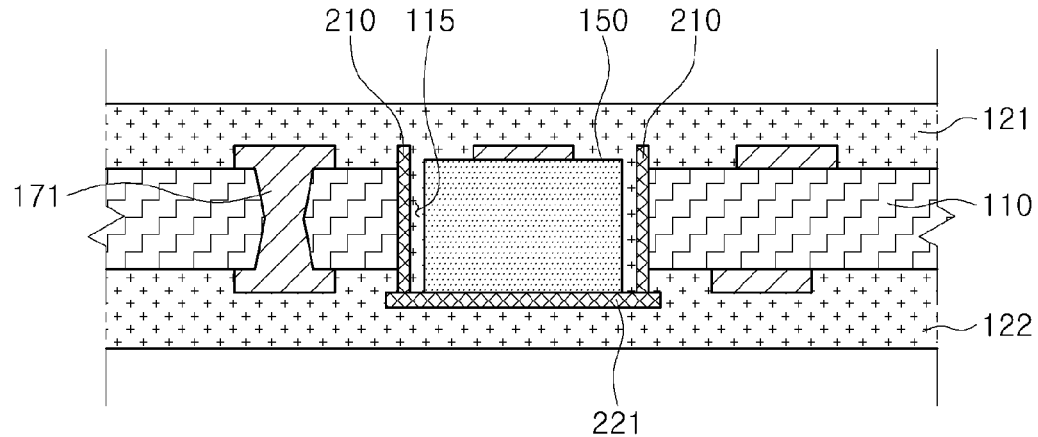

Referring to FIG. 9, an insulating layer 122 may be formed below the core layer 110.

As the insulating layer 122 below the core layer 110, the resin insulating layer may be used, similar to the insulating layer 121 on the core layer 110.

Figure 10:
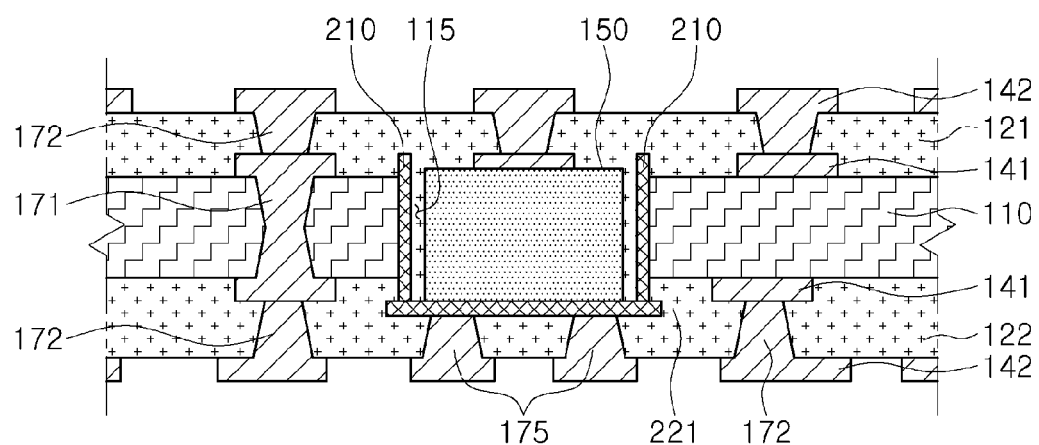

Referring to FIG. 10, first signal vias 172 and discharging vias 175 that penetrate through the insulating layers 121 and 122 and first outer layer circuits 142 on the surfaces of the insulating layers 121 and 122 may be formed.

The first signal vias 172 and the discharging vias 175 may be formed by forming vias holes (not shown) in the insulating layers 121 and 122 and filling the via holes (not shown) with a conductive material by the plating process.

The via holes (not shown) may be formed by using a mechanical drill or a laser drill, but are not necessarily limited thereto.

The laser drill may be a $CO_2$ laser drill or a YAG laser drill, but is not necessarily limited thereto.

In this case, the discharging vias 175 may be formed by exposing at least one of the conductive partitions 210 and the lower conductive shielding layer 221 at the time of the forming of the via holes and filling the via holes with the conductive material by the plating process.

The first outer layer circuits 142 may be formed by forming a plating resist (not shown) which is patterned so as to have opening parts on the insulating layers 121 and 122 and then applying processes such as an electroless plating process and an electroplating process to the opening parts so as to fill the opening parts with the conductive material.

The inner layer circuits 141 and the first outer layer circuits 142 may be electrically connected to each other through the first signal vias 172.

Figure 11:
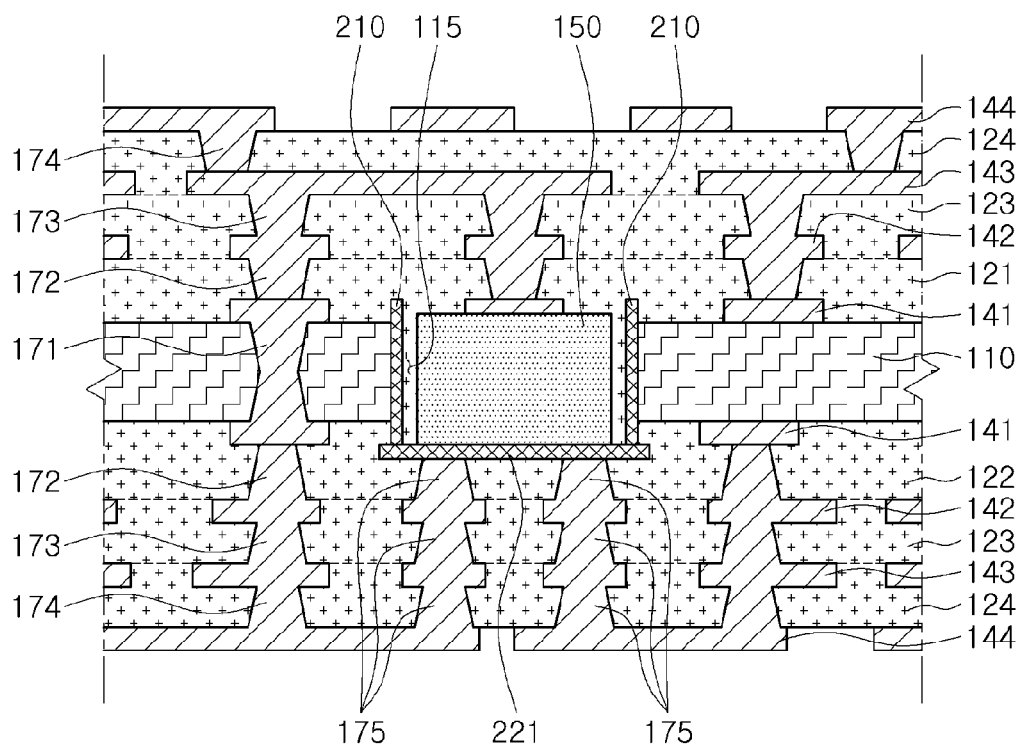

Referring to FIG. 11, a build-up layer including the second and third signal vias 173 and 174, the discharging vias 175, and the second and third outer layer circuits 143 and 144 may be further formed by further forming the insulating layers 123 on the first outer layer circuits 142 and repeating a process of forming the first signal vias 172, the discharging vias 175, and the first outer layer circuits 172.

In this case, the formed build-up layer may be formed within a scope which may be utilized by those skilled in the art.

As set forth above, according to exemplary embodiments of the present disclosure, the RF noise and the thermal noise generated by the embedded electronic component may be effectively blocked and discharged.

While exemplary embodiments have been shown and described above, it will be apparent to those skilled in the art that modifications and variations could be made without departing from the scope of the present invention as defined by the appended claims.

What is claimed is:

1. A printed circuit board comprising:
    a core layer comprising a cavity provided therein;
    an electronic component disposed in the cavity;
    a conductive partition formed on side surfaces of the cavity;
    a conductive shielding layer formed on either one of a lower surface of the electronic component and an upper surface of the electronic component;
    insulating layers disposed on and below the core layer; and
    discharging vias penetrating through the insulating layers and electrically connected to the conductive partition,
    wherein the conductive shielding layer contacts the discharging vias, and
    wherein a space formed between the conductive partition and the electronic component is filled with one of the insulating layers.

2. The printed circuit board of claim 1, wherein the conductive partition is formed on four side surfaces of the core layer adjacent to the cavity.

3. The printed circuit board of claim 1, wherein the conductive partition includes at least one selected from the group consisting of copper (Cu), aluminum (Al), and invar.

4. The printed circuit board of claim 1, wherein the conductive partition is formed by a plating process or a foil deposition process.

5. The printed circuit board of claim 1, wherein the conductive shielding layer includes at least one selected from the group consisting of copper (Cu), aluminum (Al), and invar.

6. The printed circuit board of claim 1, wherein the conductive shielding layer is formed by a plating process or by attaching a conductive supporting tape.

7. The printed circuit board of claim 1, wherein the electronic component is surrounded by the conductive partition and the conductive shielding layer.

8. A method of manufacturing a printed circuit board, the method comprising:
    forming a cavity in a core layer;
    forming a conductive partition on side surfaces of the cavity;
    inserting an electronic component into the cavity;
    forming either one of a lower conductive shielding layer, on a lower surface of the electronic component, and an upper conductive shielding layer, on an upper surface of the electronic component;
    forming insulating layers on and below the core layer;
    filling a space formed between the conductive partition and the electronic component with one of the insulating layers;
    exposing the conductive partition by forming via holes in the insulating layers; and
    forming discharging vias by filling the via holes with a conductive material using a plating process.

9. The method of claim 8, further comprising, before the forming of the insulating layers on and below the core layer, forming the lower conductive shielding layer below the cavity.

10. The method of claim 8, further comprising, before the forming of the insulating layers on and below the core layer, forming the upper conductive shielding layer on the cavity.

11. The method of claim 8, wherein the inserting of the electronic component into the cavity includes:
    forming a supporting tape below the core layer; and
    attaching the electronic component to the supporting tape.

12. The method of claim 11, wherein the supporting tape is a conductive supporting tape including at least one selected from the group consisting of copper (Cu), aluminum (Al), and invar.

13. The method of claim 8, wherein the conductive partition is formed by a plating process or a foil deposition process.

14. The method of claim 9, wherein the lower conductive shielding layer is formed by a plating process or by attaching a conductive supporting tape.

15. A printed circuit board comprising:
    a core layer comprising a cavity provided therein;
    an electronic component disposed in the cavity;
    a conductive partition formed on side surfaces of the core layer adjacent to the cavity;
    a conductive shielding layer formed on either one of a lower surface of the electronic component and an upper surface of the electronic component;
    insulating layers disposed on and below the core layer; and
    discharging vias electrically connected to the conductive partition, wherein the discharging vias are exposed to an exterior of the printed circuit board and penetrate through the insulating layers,
    wherein a space formed between the conductive partition and the electronic component is filled with one of the insulating layers.

16. A method of manufacturing a printed circuit board, the method comprising:
    forming a cavity in a core layer;
    forming a conductive partition on side surfaces of the core layer adjacent to the cavity;
    inserting an electronic component into the cavity;
    forming either one of a lower conductive shielding layer, on a lower surface of the electronic component, and an upper conductive shielding layer, on an upper surface of the electronic component;
    forming insulating layers on and below the core layer;
    exposing the conductive partition by forming via holes in the insulating layers;
    forming discharging vias by filling the via holes with a conductive material using a plating process; and filling a space formed between the conductive partition and the electronic component with one of the insulating layers,
wherein the discharging vias are exposed to an exterior of the printed circuit board and penetrate through the insulating layers.

* * * * *